(12) United States Patent
Kim et al.

(10) Patent No.: US 10,290,343 B2
(45) Date of Patent: May 14, 2019

(54) MEMORY DEVICES THAT SAMPLE LATCH TRIP VOLTAGES PRIOR TO READING DATA INTO LATCHES AND METHODS OF OPERATING SAME

(71) Applicant: Samsung Electronics Co., Ltd., Suwon-si, Gyeonggi-do (KR)

(72) Inventors: ChaeHoon Kim, Suwon-si (KR); Kyoman Kang, Gunpo-si (KR); Tae-Hong Kwon, Seoul (KR); Taeyun Lee, Suwon-si (KR); Jin-Young Chun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/608,219

(22) Filed: May 30, 2017

(65) Prior Publication Data
US 2018/0096718 A1   Apr. 5, 2018

(30) Foreign Application Priority Data
Sep. 30, 2016 (KR) .......................... 10-2016-0127016

(51) Int. Cl.
| | |
|---|---|
| *G11C 11/4091* | (2006.01) |
| *G11C 5/14* | (2006.01) |
| *G11C 7/06* | (2006.01) |
| *G11C 16/24* | (2006.01) |
| *G11C 16/26* | (2006.01) |
| *G11C 16/32* | (2006.01) |
| *G11C 7/12* | (2006.01) |

(Continued)

(52) U.S. Cl.
CPC .......... *G11C 11/4091* (2013.01); *G11C 5/145* (2013.01); *G11C 7/06* (2013.01); *G11C 16/24* (2013.01); *G11C 16/26* (2013.01); *G11C 16/32* (2013.01); *G11C 7/12* (2013.01); *G11C 16/0483* (2013.01); *G11C 27/02* (2013.01); *G11C 2013/0042* (2013.01); *G11C 2013/0054* (2013.01)

(58) Field of Classification Search
CPC .................. G11C 11/4091; G11C 7/12; G11C 2013/0042; G11C 2013/0054
USPC ......................................................... 365/205
See application file for complete search history.

(56) References Cited

U.S. PATENT DOCUMENTS

| | | |
|---|---|---|
| 7,379,337 B2 | 5/2008 | Park |
| 7,679,966 B2 | 3/2010 | Kang et al. |

(Continued)

FOREIGN PATENT DOCUMENTS

| | | |
|---|---|---|
| KR | 10-0706247 B1 | 4/2007 |
| KR | 10-2009-0049373 A | 5/2009 |

(Continued)

*Primary Examiner* — Fernando Hidalgo
(74) *Attorney, Agent, or Firm* — Myers Bigel, P.A.

(57) ABSTRACT

Methods of operating a memory device include at least partially charging a sensing node within a page buffer of the memory device to a first precharge voltage, by sampling a trip voltage of a sensing latch within the page buffer. Thereafter, a voltage of the sensing node is boosted from the first precharge voltage to a higher second precharge voltage. Then, a voltage of the sensing node that reflects a value of data stored in a memory cell of the memory device is developed at the sensing node. The developed voltage is then transferred to the sensing latch so that data stored by the sensing latch reflects the value of data stored in the memory cell.

24 Claims, 9 Drawing Sheets

(51) Int. Cl.
*G11C 13/00* (2006.01)
*G11C 16/04* (2006.01)
*G11C 27/02* (2006.01)

(56) References Cited

U.S. PATENT DOCUMENTS

| | | |
|---|---|---|
| 8,023,335 B2 | 9/2011 | Kang |
| 8,351,274 B2 | 1/2013 | Ha et al. |
| 8,462,555 B2 | 6/2013 | Park |
| 8,582,362 B2 | 11/2013 | Koo |
| 8,593,867 B2 | 11/2013 | Lee et al. |
| 9,123,430 B2 | 9/2015 | Cernea |
| 2014/0269094 A1* | 9/2014 | Maeda ................ G11C 16/26 365/185.21 |
| 2014/0334233 A1* | 11/2014 | Joo ..................... G11C 16/26 365/185.21 |

FOREIGN PATENT DOCUMENTS

| | | |
|---|---|---|
| KR | 10-1010175 B1 | 1/2011 |
| KR | 10-1053745 B1 | 7/2011 |
| KR | 10-1468149 B1 | 11/2014 |

\* cited by examiner

MEMORY DEVICES THAT SAMPLE LATCH TRIP VOLTAGES PRIOR TO READING DATA INTO LATCHES AND METHODS OF OPERATING SAME

REFERENCE TO PRIORITY APPLICATION

A claim for priority under 35 U.S.C. § 119 is made to Korean Patent Application No. 10-2016-0127016 filed Sep. 30, 2016, in the Korean Intellectual Property Office, the entire contents of which are hereby incorporated by reference.

BACKGROUND

Embodiments of the inventive concept disclosed herein relate to semiconductor memory devices, and to methods of operating memory devices.

Semiconductor memory devices are classified into volatile semiconductor memory devices and nonvolatile semiconductor memory devices. The read and write speeds of the volatile memory device are fast, but when a power voltage supply is interrupted, data stored therein disappears. In contrast, even though power is interrupted, information stored in the nonvolatile semiconductor memory device does not disappear. Therefore, the nonvolatile semiconductor memory device stores information to be retained regardless of whether power is supplied.

A typical example of the volatile memory device may be a dynamic random access memory (DRAM) or a static RAM (SRAM). A typical example of the nonvolatile semiconductor memory device may be a flash memory device. The flash memory device is being used as a voice and image data storage medium of information devices such as a computer, a cellular phone, a smartphone, a personal digital assistant (PDA), a digital camera, a camcorder, a voice recorder, an MP3 player, a handheld PC, a game console, a facsimile, a scanner, and a printer. Nowadays, technologies for high-capacity, high-speed, and low-power nonvolatile memory devices are being researched to mount the nonvolatile memory device in mobile devices including a smartphone.

Technologies for guaranteeing data integrity are being continuously developed as the high-capacity, high-speed, and low-power technologies are being developed. In particular, there are attempts to increase a sensing margin of a sense amplifier in consideration of a relatively low driving voltage for low power.

SUMMARY

Embodiments of the inventive concept provide a memory device that compensates for a variation in a trip voltage of a latch to increase a sensing margin of a sense amplifier and a data read method thereof.

Methods of operating memory devices according to some embodiments of the invention include at least partially charging a sensing node within a page buffer of the memory device to a first precharge voltage, by sampling a trip voltage of a sensing latch within the page buffer. Thereafter, a voltage of the sensing node is boosted from the first precharge voltage to a higher second precharge voltage. Then, a voltage of the sensing node that reflects a value of data stored in a memory cell of the memory device is developed at the sensing node. The developed voltage is then transferred to the sensing latch so that data stored by the sensing latch reflects the value of data stored in the memory cell.

According to additional embodiments of the invention, the page buffer is configured to include a boosting capacitor having a first terminal electrically connected to the sensing node, and the boosting operation includes driving a second terminal of the boosting capacitor with a voltage having a magnitude greater than the first precharge voltage so that the sensing node increases in voltage. The developing operation may include electrically coupling the sensing node to a bit line in the memory device, which is electrically connected to the memory cell. In addition, the operation to at least partially charge a sensing node may be performed while the bit line is electrically isolated from the sensing node. The boosting operation may also be performed while the bit line is electrically isolated from the sensing node.

According to still further embodiments of the invention, the operation of at least partially charging a sensing node may include electrically coupling a first node of the sensing latch to the sensing node. In particular, the electrically coupling of a first node of the sensing latch to the sensing node may include turning on a transistor having a gate terminal responsive to a sense enable signal. The sense enable signal may be driven to a first logic level during the at least partially charging a sensing node and during at least a portion of the transferring the developed voltage to the sensing latch.

According to still further embodiments of the invention, the at least partially charging a sensing node may be preceded by setting the trip voltage of the sensing latch to a logic high value by pulling a second node of the sensing latch to a logic low value, in response to an active set signal. In addition, the operation of transferring the developed voltage to the sensing latch may be followed by transferring the value of data stored in the memory cell from the sensing latch to an input/output buffer associated with the memory device.

According to another aspect of an embodiment of the invention, a nonvolatile memory device includes a memory cell, a page buffer connected with a bit line of the memory cell and a latch that senses data stored in the memory cell through the bit line and a sensing node connected to the bit line, and control logic controlling the latch during a read operation to sample a trip voltage of the latch, to charge the sensing node with the sampled trip voltage, and to charge the sensing node, which is charged with the trip voltage, up to a precharge voltage. The trip voltage is sampled by electrically connecting one end of the latch and the sensing node.

According to another aspect of an embodiment of the invention, a read method of a nonvolatile memory device includes sampling a trip voltage of a latch, boosting the sampled trip voltage up to a precharge voltage through boosting, and developing the sensing node based on data stored in a memory cell.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

It should be understood that both the foregoing general description and the following detailed description are provided as examples, for illustration and not for limiting the scope and spirit of the claimed invention. Reference will now be made in detail to embodiments of the inventive concept, examples of which are illustrated in the accompanying drawings. Wherever possible, the same reference numbers are used in the drawings and the description to refer to the same or like parts.

Below, a NAND flash memory device may be used as an example of a nonvolatile memory device for describing features and functions of the inventive concept. However, one skilled in the art may easily understand other features and performances from information disclosed herein. For example, a technology disclosed in this specification, according to an embodiment of the inventive concept, may be used in a phase-change RAM (PRAM), a magnetoresistive RAM (MRAM), a resistive RAM (ReRAM), a ferroelectric RAM (FRAM), a NOR flash memory, etc. In addition, an SRAM may be exemplified as a volatile memory for describing features and functions of the inventive concept. However, it may be understood that the features and functions of the inventive concept are applied to a memory such as a DRAM.

The inventive concept may be implemented or applied through other embodiments. In addition, the detailed description may be changed or modified according to view points and applications without departing from the claims, the scope and spirit, and any other purposes of the inventive concept.

Figure 1:
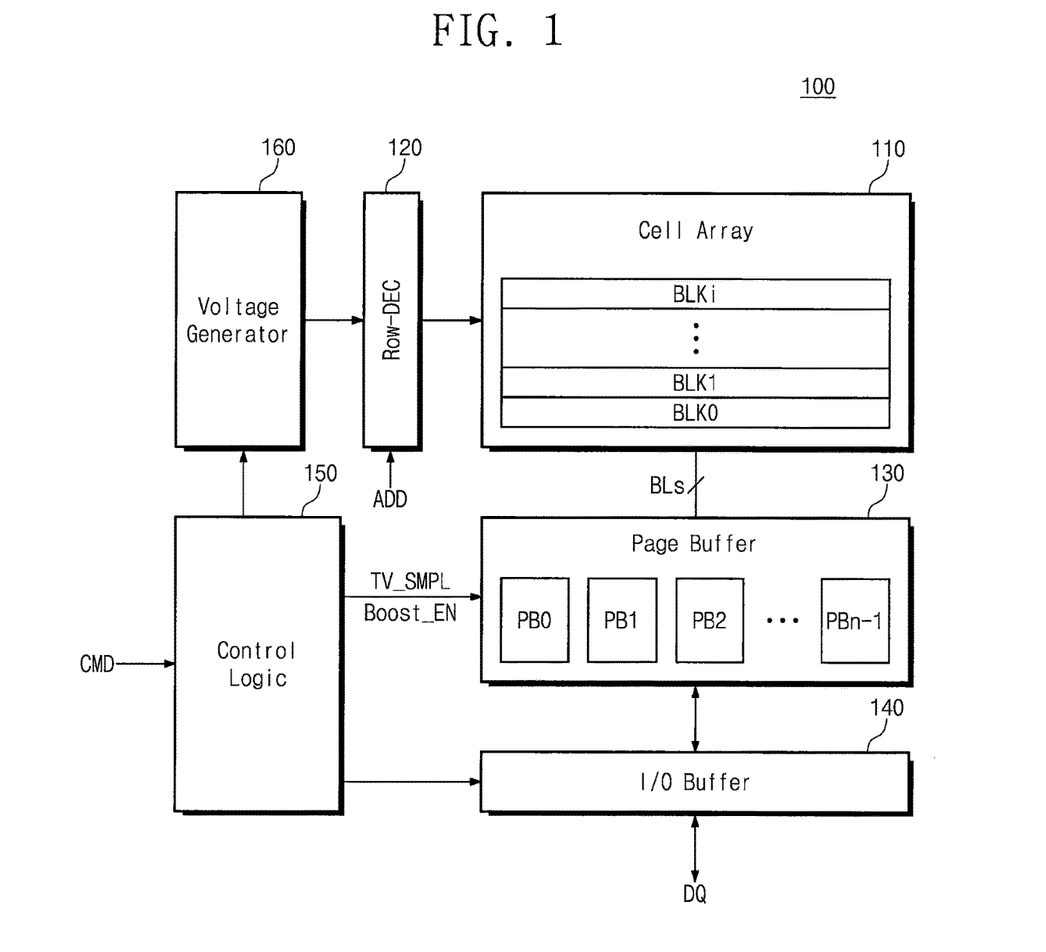
FIG. 1 is a block diagram illustrating a nonvolatile memory device, according to an embodiment of the inventive concept.

FIG. 1 is a block diagram illustrating a nonvolatile memory device, according to an embodiment of the inventive concept. Referring to FIG. 1, a nonvolatile memory device 100 may include a cell array 110, a row decoder 120, a page buffer block 130, an input/output buffer 140, control logic 150, and a voltage generator 160.

The cell array 110 is connected to the row decoder 120 through word lines and/or string and ground selection lines SSL and GSL. The cell array 110 is connected to the page buffer block 130 through bit lines. The cell array 110 includes a plurality of NAND cell strings. A channel of each NAND cell string may be formed in a vertical or horizontal direction. According to an embodiment, the cell array 110 may include a plurality of memory cells that constitute a NAND cell string. The memory cells may be programmed, erased, and read by voltages provided to the bit lines and the word lines. A program operation may be performed in units of a page, and an erase operation may be performed in units of a block (e.g., one of BLK0 to BLKi).

As an embodiment of the present inventive concept, the cell array 110 may be implemented to have a three-dimensional (3D) memory array structure. The 3D memory array may be monolithically formed in one or more physical level(s) of a memory cell array having an active area arranged on a circuit related on a silicon substrate and an operation of memory cells. The circuit related on an operation of memory cells may be located in a substrate or on a substrate. The term "monolithic" means that layers of each level of the array are directly deposited on the layers of each underlying level of the array.

In an embodiment of the inventive concept, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. At least one selection transistor may have the same structure as those of memory cells and may be monolithically formed together with memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The row decoder 120 may select one of the memory blocks BLK0 to BLKi of the cell array 110 in response to an address ADD. Also, the row decoder 120 may select one of the word lines of the selected memory block in response to the address ADD. The row decoder 120 may supply a voltage corresponding to a mode of operation to the selected word line of the selected memory block. During a program operation, the row decoder 120 may supply a program/verification voltage to the selected word line and a pass voltage to each of unselected word lines. During a read operation, the row decoder 120 may supply a selection read voltage to the selected word line and a non-selection read voltage to each of the unselected word lines.

The page buffer block 130 operates as a write driver for writing data into the cell array 110 or a sense amplifier for reading data stored in the cell array 110. During the program operation, the page buffer block 130 may supply a bit line voltage corresponding to data to be programmed to a bit line of the cell array 110. During the read operation or a verification read operation, the page buffer block 130 may sense data stored in selected memory cells through the bit lines. The page buffer block 130 may include a plurality of page buffers PB0 to PBn-1, each of which is connected to one or two bit lines.

Each of the page buffers PB0 to PBn-1 senses data stored in a memory cell through a bit line. A bit line and a sensing node are precharged for sensing. During a sensing operation, the precharged voltages of the bit line and the sensing node are developed according to data stored in a memory cell connected to the bit line. Each of the page buffers PB0 to PBn-1 stores a change of the precharged voltage in a latch therein. According to an embodiment of the inventive concept, each of the page buffers PB0 to PBn-1 samples a trip voltage of a latch (hereinafter referred to as a "sensing latch"), which is provided for sensing, in response to a control signal TV_SMPL before a sensing node and a bit line are precharged. Each of the page buffers PB0 to PBn-1 precharges the sensing node and the bit line with a precharge voltage, to which the sampled trip voltage is applied, in response to a control signal Boost_EN. A trip voltage sampling operation, a precharge operation, a develop operation, and a latch operation will be described in detail with reference to the following drawings.

The I/O buffer 140 may provide data received from the outside to the page buffer block 130. The I/O buffer 140 may provide a command CMD received from the outside to the control logic 150. The I/O buffer 140 may provide the address ADD received from the outside to the control logic 150 or the row decoder 120. In addition, the I/O buffer 140 may output data sensed and latched by the page buffer block 130 to the outside.

The control logic 150 may control the page buffer block 130 and the row decoder 120 in response to the command CMD received from the outside. The control logic 150 may control the page buffer block 130 and the row decoder 120 in response to the command CMD so as to perform a program, read, or erase operation on a select memory cell.

In particular, the control logic 150 controls the page buffer block 130 so as to sample trip voltages of the sensing latches included in the page buffer block 130 during the read operation. The control logic 150 controls the page buffer block 130 such that precharge voltages of the bit lines/sensing nodes are adjusted according to the sampled trip voltages. The control logic 150 provides the page buffer block 130 with the control signals TV_SMPL and Boost_EN to sample the trip voltages of the sensing latches and to perform a precharge operation such that the sampled trip voltages are respectively applied to the precharge voltages.

Under control of the control logic 150, the voltage generator 160 generates various kinds of word line voltages to be provided to the word lines and a voltage to be provided to a bulk (e.g., a well area) in which the memory cells are formed. The word line voltages to be supplied to the word lines include a program voltage (e.g., Vpgm), a pass voltage (e.g., Vpass), selection and non-selection read voltages (e.g., Vrd and Vread), etc.

According to an embodiment, the nonvolatile memory device 100 may apply a variation in a trip voltage of the sensing latch included in each page buffer to the precharge operation during the sensing operation. Accordingly, a high sensing margin may be provided by compensating for a level of a precharge voltage of a bit line or a sensing node based on a trip voltage of a latch.

Figure 2:
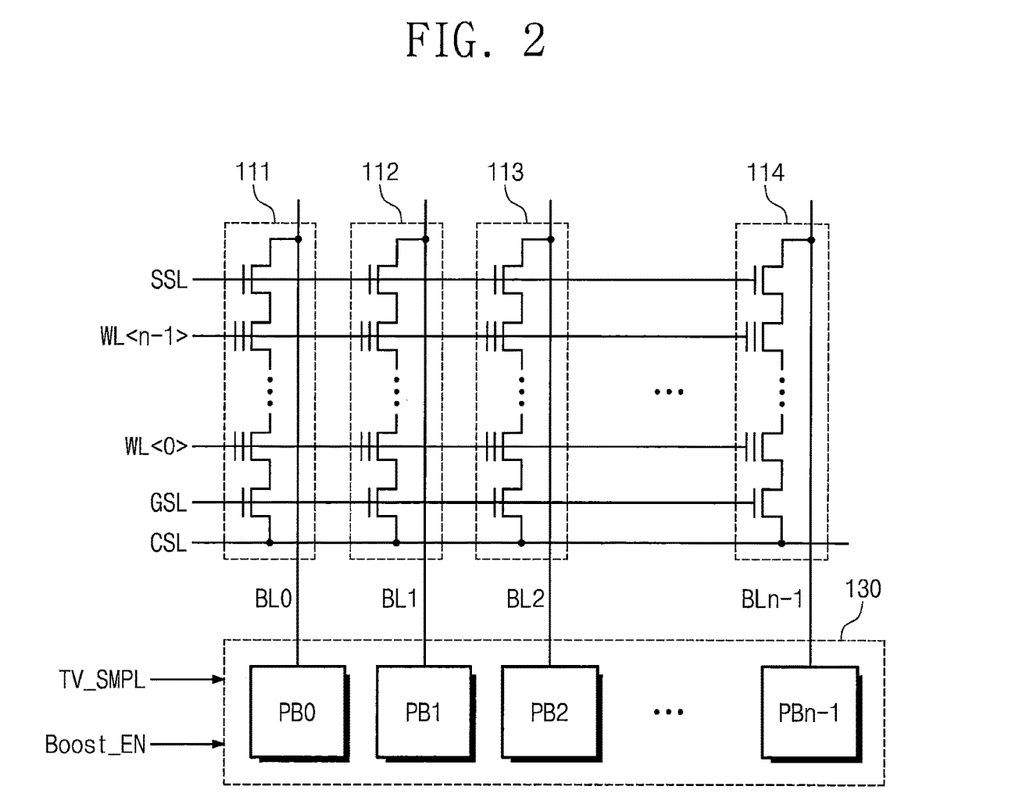
FIG. 2 is a block diagram illustrating a configuration of a cell array and a page buffer illustrated in FIG. 1.

FIG. 2 is a block diagram illustrating a configuration of a cell array and a page buffer illustrated in FIG. 1. Referring to FIG. 2, the page buffers PB0 to PBn-1 may be connected to bit lines BL0 to BLn-1, respectively. The bit lines BL0 to BLn-1 may be connected to NAND cell strings 111, 112, 113 . . . and 114.

The NAND cell strings 111, 112, 113 . . . and 114 included in the cell array 110 are connected with the bit lines BL0 to BLn-1 through string selection transistors SST, respectively. A gate of each string selection transistor SST is connected to a string selection line SSL. Also, the NAND cell strings 111, 112, 113 . . . and 114 are connected to a common source line CSL through ground selection transistors GST thereof. A gate of each ground selection transistor is connected to a ground selection line GSL.

The page buffer PB0 is connected with the NAND cell string 111 through the bit line BL0. During the program operation, the page buffer PB0 may set up or precharge the bit line BL0. During the read operation, the page buffer PB0 may sample a trip voltage of a latch thereof in response to the sampling control signal TV_SMPL. In addition, the page buffer PB0 precharges the bit line BL0 and a sensing node SO with a voltage including a component of the sampled trip voltage Vtrip in response to the control signal Boost_EN. The page buffer PB0 stores a develop result of the precharged voltage in the sensing latch.

The remaining page buffers PB1 and PBn-1 may respectively precharge and sense bit lines, connected thereto, and sensing nodes thereof, based on the same procedure as that of the page buffer PB0.

The operation of the page buffer PB0, which is performed to compensate for a variation in a trip voltage of a latch during the read operation, is described above. The page buffers PB0 to PBn-1 may respectively sample trip voltages of the sensing latches thereof in response to the control signals TV_SMPL and Boost_EN provided from the control logic 150. The sensing nodes and the bit lines may be precharged according to levels of the sampled trip voltages.

Figure 3:
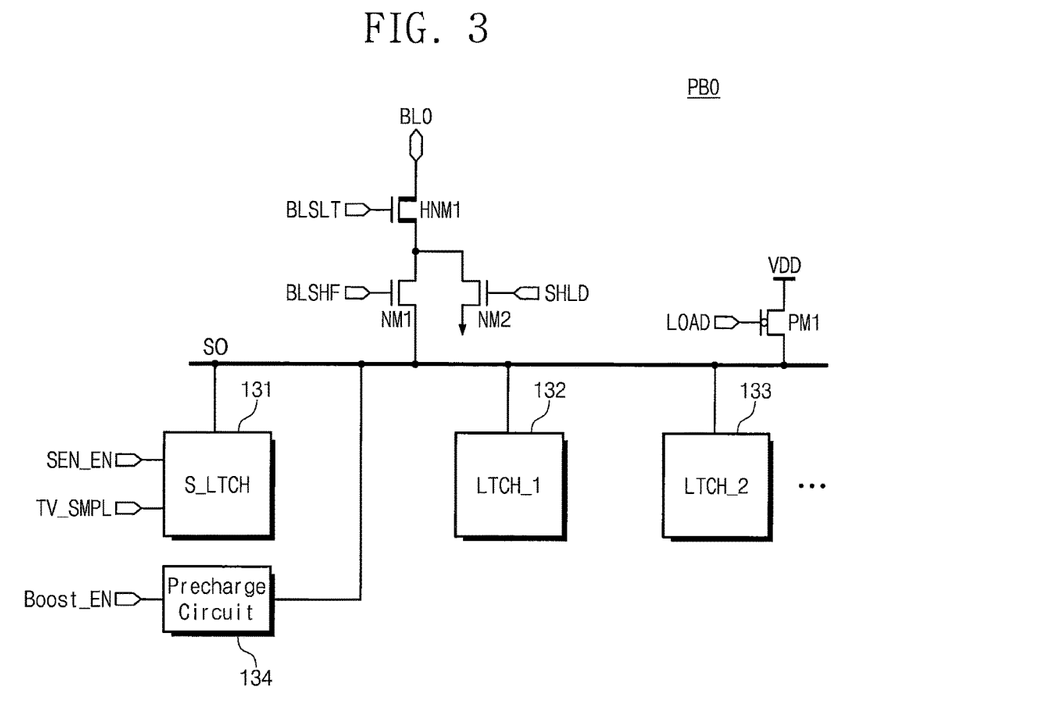
FIG. 3 is a block diagram illustrating a structure of a page buffer of FIG. 2.

FIG. 3 is a block diagram illustrating a structure of the page buffer PB0 of FIG. 2. Referring to FIG. 3, the page buffer PB0 connected to the bit line BL0 may be connected to memory cells of the NAND cell string 111 (refer to FIG. 2). The page buffer PB0 may include the sensing node SO connected to the bit line BL0. The page buffer PB0 may further include a plurality of latches 131, 132, and 133 that are connected to the sensing node SO. The data latches 132 and 133 may be used to store a value sensed by the sensing latch 131 or to output the value to the outside.

Through the above-described configuration, the page buffer PB0 may perform a read operation including trip voltage sampling, precharging, developing, and latching.

If the read operation starts, first, the trip voltage sampling may be made. Control signals SEN_EN and TV_SMPL from the control logic 150 are activated for the trip voltage sampling. When the sampling control signal TV_SMPL for sampling the trip voltage Vtrip of the page buffer PB0 is activated, the trip voltage Vtrip of a latch provided in the sensing latch (S_LTCH) 131 is transferred to the sensing node SO. At the same time, the sensing enable signal SEN_EN for turning on a transistor (or a reset transistor) that connects the latch of the sensing latch 131 and the sensing node SO may be provided to the sensing latch 131. The trip voltage Vtrip of the latch is transferred to the sensing node SO by the control signals SEN_EN and TV_SMPL.

Next, the boosting enable signal Boost_EN may be provided from the control logic 150 for precharging. In response to the boosting enable signal Boost_EN, a precharge circuit 134 further precharges the sensing node SO and the bit line BL0, which have the trip voltage Vtrip, by a boosting voltage Vbst. The level of the boosting voltage Vbst may be set in advance for precharging. The level of the boosting voltage Vbst may be determined in consideration of capacitance and coupling effect of the sensing node SO and the bit line BL0. That is, a difference between a substantially provided voltage and an increased voltage of the sensing node SO may vary with the capacitance. The level of the boosting voltage Vbst may be determined in consideration of the capacitance.

In the developing, the sensing latch 131 and the precharge circuit 134 may be separated from the sensing node SO. Voltages precharged on the sensing node SO and the bit line BL0 may vary with a value of data stored in a selected memory cell.

In the latching, a level of a developed voltage of the sensing node SO is stored in the latch of the sensing latch 131 as data of logic "0" or logic "1". In this case, the sensing enable signal SEN_EN may be activated to connect the latch with the sensing node SO having the developed voltage.

A configuration and an operation of the page buffer PB0 for use in sampling a trip voltage and using the sampled trip voltage for the precharge operation are briefly described above. Here, it may be well understood that the precharge circuit 134 is implemented by modifying or changing a configuration of an existing load transistor PM1.

Figure 4:
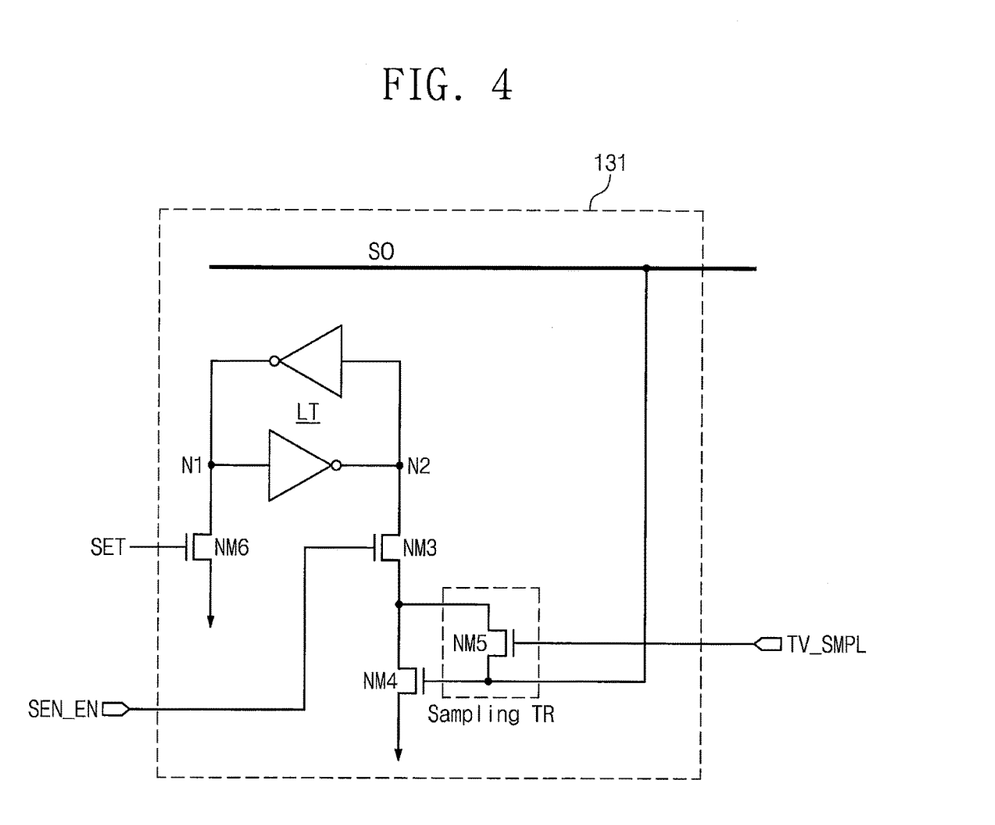
FIG. 4 is a circuit diagram illustrating a structure of a sensing latch described with reference to FIG. 3.

FIG. 4 is a circuit diagram illustrating a structure of the sensing latch 131 described with reference to FIG. 3. Referring to FIG. 4, the sensing latch 131 includes a latch LT, which is composed of cross-coupled inverters, and a plurality of transistors NM3 to NM6. In the structure of the sensing latch 131, only elements that are needed to describe an operation of sampling the trip voltage Vtrip are illustrated in FIG. 4. Accordingly, all elements for transferring data to other data latches are not illustrated in the structure of the sensing latch 131.

The latch LT may be implemented with an asynchronous binary storage element that does not have a clock input. The latch LT may be composed of complementary metal—oxide—semiconductor (CMOS) inverters each of which is composed of a pair of a PMOS transistor and an NMOS transistor. The latch LT may be implemented with a bistable circuit in which inputs and outputs of two inverters are cross-coupled to each other. The latch LT may be implemented with a latch circuit of a full complementary feedback manner. That is, when any one node N1 of the latch LT has logic "1", the other node N2 thereof always has logic "0". A transistor-level structure of the latch LT will be described in detail with reference to FIG. 10.

The latch LT transitions or trips to a voltage of any one of logic "1" (or logical "H") and logic "0" (or logical "L") by a voltage provided to any one of the nodes N1 and N2. For example, it is assumed that the first node N1 has logic "0" and the second node N2 has logic "1". In this assumption, when a voltage (e.g., VDD) corresponding to logic "1" is provided to the first node N1, the first node N1 may transition to a state of logic "1". A state of the second node N2 always is complementary to that of the first node N1.

During the sensing operation, first, the bit line BL0 and the sensing node SO are precharged with a precharge voltage. The precharged voltage of the sensing node SO varies with a data state of a memory cell in the developing. If the sensing enable signal SEN_EN is activated after developing of the sensing node SO sufficiently progresses, a reset transistor NM3 is turned on. In this case, if a level of the changed voltage of the sensing node SO corresponds to logic "0", a ground transistor NM4 may remain at a turn-off state, and thus the latch LT may retain a previous state. In contrast, if a level of the changed voltage of the sensing node SO corresponds to logic "1", the ground transistor NM4 is turned on, and thus the second node N2 of the latch LT is grounded. That is, the second node N2 of the latch LT is set to logic "0" (e.g., a trip operation of the latch LT is performed).

The above-described trip operation of the latch LT is considerably associated with a switching characteristic of the ground transistor NM4. In addition, the trip operation of the latch LT is considerably associated with a characteristic of a pull-up transistor (not illustrated) of the latch LT. The event that a threshold voltage of the ground transistor NM4 or a driving capacity of the pull-up transistor of the latch LT varies due to various factors may occur. In this case, even though a voltage of the sensing node SO is developed to a voltage sufficient for the latch LT to trip, the case where data is not substantially stored in the latch LT may occur. This characteristic may be defined as a variation in the trip voltage Vtrip of the latch LT.

According to an embodiment of the inventive concept, the sensing latch 131 may include an element for compensating for the variation in the trip voltage Vtrip of the latch LT. That is, the sensing latch 131 includes a sampling transistor NMS. During the read operation, first, the page buffer PB0 samples the trip voltage Vtrip of the latch LT. The sampling of the trip voltage Vtrip may be made by turning on the transistors NM3 and NM5 such that a voltage applied to the ground transistor NM4 is transferred to the sensing node SO. The sensing enable signal SEN_EN and the sampling control signal TV_SMPL provided from the control logic 150 may be activated to turn on the transistors NM3 and NM5.

The trip voltage Vtrip may be sampled before the sensing node SO is precharged. The sensing node SO may be charged with the sampled trip voltage Vtrip. A precharge voltage of a predetermined level may be applied to the sensing node SO and a bit line in a state where the sensing node SO is first charged with the trip voltage Vtrip.

Here, the transistor NM6 that is controlled by a set signal SET may be an element for setting the first node N1 of the latch LT to a ground level. For example, the set signal SET may be activated upon resetting the sensing latch 131.

The structure of the sensing latch 131 or the page buffer PB0 that is capable of sampling the trip voltage Vtrip of the latch LT is described with reference to FIG. 4. According to an embodiment, the sensing latch 131 includes the sampling transistor NM5 for transferring the trip voltage Vtrip of the latch LT to the sensing node SO. The trip voltage Vtrip of the latch LT is loaded on the sensing node SO through the sampling transistor NM5. Afterward, a level of the trip voltage Vtrip may be retained for a time by the capacitance of the sensing node SO.

Figure 5:
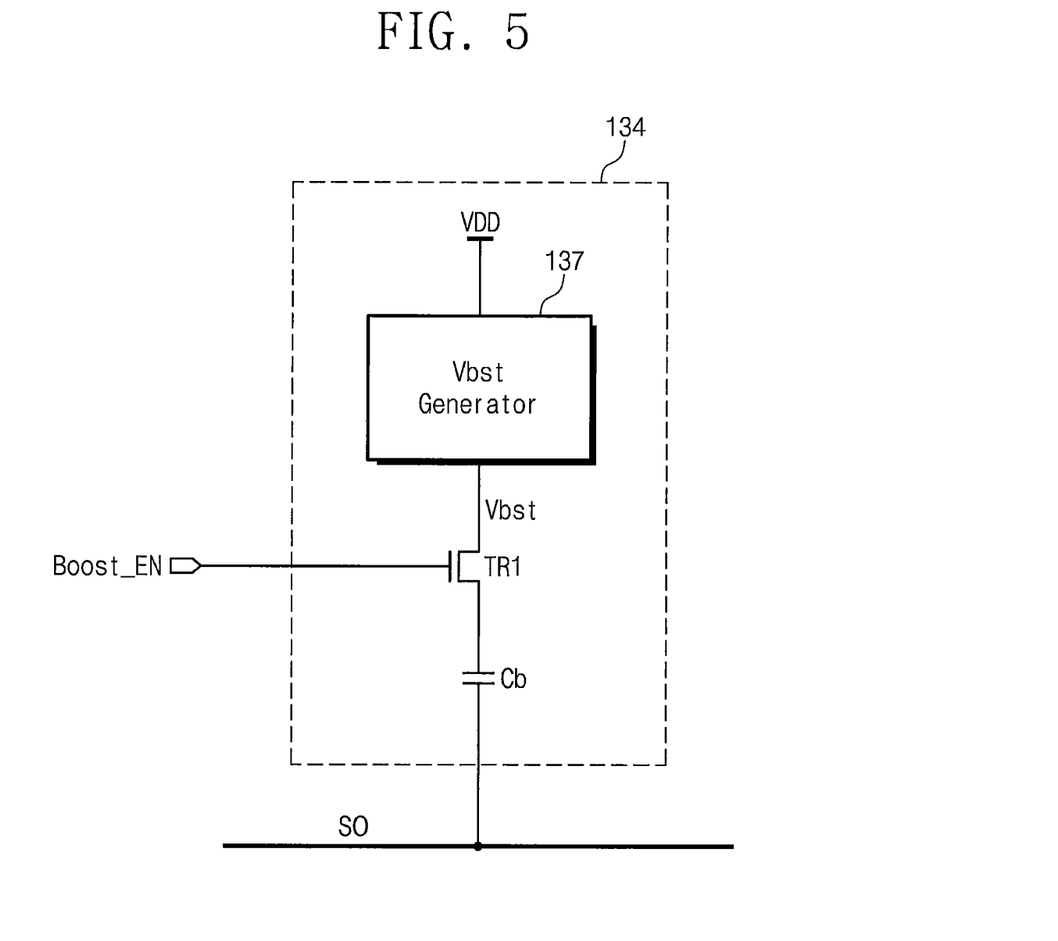
FIG. 5 is a drawing illustrating a precharge circuit of FIG. 3.

FIG. 5 is a drawing illustrating the precharge circuit 134 of FIG. 3. Referring to FIG. 5, the precharge circuit 134 may include a boosting voltage generator 137, a boosting transistor TR1, and a boosting capacitor Cb.

The sensing latch 131 may apply a sampled trip voltage Vtrip to the sensing node SO. The precharge circuit 134 additionally charges the sensing node SO, which is first charged by the sampling of the trip voltage Vtrip, with the boosting voltage Vbst. The sensing node SO may maintain a level of the trip voltage Vtrip through the sampling. Next, during the precharge operation, the precharge circuit 134 may apply the boosting voltage Vbst, which is determined in advance, to the sensing node SO by using the boosting capacitor Cb.

During the precharge operation, the boosting enable signal Boost_EN from the control logic 150 is activated. In this case, the boosting transistor TR1 is turned on, and thus the boosting voltage Vbst generated by the boosting voltage generator 137 is transferred to the sensing node SO through the boosting capacitor Cb. According to the precharge operation of the boosting manner, the sensing node SO is first charged with the trip voltage Vtrip and is then charged with the boosting voltage Vbst.

A voltage transferred to the sensing node SO through the boosting capacitor Cb may be lower in level than the boosting voltage Vbst, due to a parasitic capacitance existing in the sensing node SO. For example, when the sensing node SO is precharged with the boosting voltage Vbst of 3 V, a voltage of the sensing node SO may be substantially increased by 1.5 V. The boosting voltage Vbst may be determined based on all characteristics of the sensing node SO and the page buffer PB0.

The boosting voltage generator 137 may be implemented to have any one of various voltage generator structures such as a voltage division structure and a charge pump structure.

Figure 6:
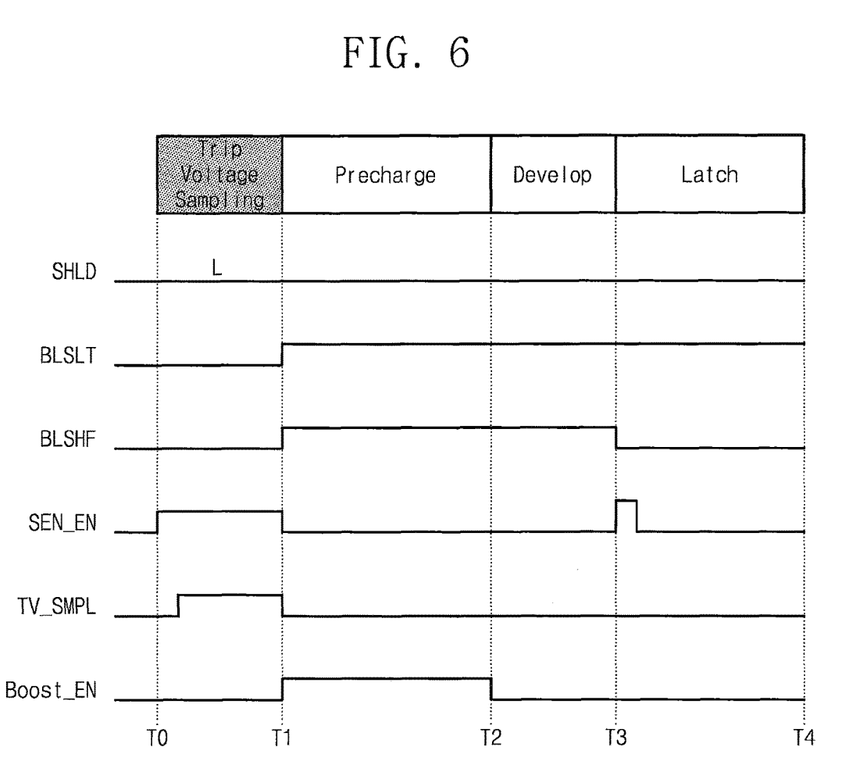
FIG. 6 is a timing diagram illustrating an operation of a page buffer in a read operation, according to an embodiment of the inventive concept.

FIG. 6 is a timing diagram illustrating an operation of a page buffer in a read operation, according to an embodiment of the inventive concept. According to an embodiment of the inventive concept, a sensing process will be described below with reference to FIGS. 3 to 6. If the nonvolatile memory device 100 receives a read command, a read operation for sensing selected memory cells starts.

At a point in time T0, trip voltage sampling is made prior to a precharge operation. For the trip voltage sampling, the control logic 150 deactivates control signals SHLD, BSLST, and BSSHF to a low level "L" to electrically separate the sensing node SO of the page buffer block 130 from the bit line BL0. Here, voltage levels of the control signals BSLST and BSSHF do not need to be 0 V. For example, it may be well understood that voltage levels of the control signals BSLST and BSSHF are higher than 0 V. At the same time, to sample a trip voltage of the latch LT, the control logic 150 activates the sensing enable signal SEN_EN such that the reset transistor NM3 is turned on. The control logic 150 activates the sampling control signal TV_SMPL to turn on the sampling transistor NM5. That is, the control logic 150 makes the sensing enable signal SEN_EN and the sampling control signal TV_SMPL transition to a high level "H".

If the reset transistor NM3 and the sampling transistor NM5 are respectively turned on by the sensing enable signal SEN_EN and the sampling control signal TV_SMPL, the second node N2 of the latch LT is electrically connected with the sensing node SO. The sensing node SO is charged with charges supplied to the second node N2. The voltage charged on the sensing node SO through the sampling may be increased up to a point in time when the amount of current supplied from a pull-up transistor (e.g., a PMOS transistor) of the latch LT is the same as the amount of current discharged to a ground through the transistor NM4. That is, the second node N2 and the sensing node SO are charged until voltages of the second node N2 and the sensing node SO reach the trip voltage Vtrip.

At a point in time T1, a precharge operation is performed on the sensing node SO and the bit line BL0. For the precharge operation, the sensing enable signal SEN_EN and the sampling control signal TV_SMPL are deactivated to a low level "L". Accordingly, the latch LT is electrically isolated from the sensing node SO. Next, the control signals BLSLT and BLSHF are activated to a high level "H" to connect the sensing node SO with the bit line BL0. In this case, the control signal SHLD for grounding the bit line BL0 remains at a deactivation state of a low level "L". The boosting enable signal Boost_EN is activated to a high level "H" while the bit line BL0 and the sensing node SO are electrically connected to each other. In response to the boosting enable signal Boost_EN of a high level, the precharge circuit 134 boosts the trip voltage Vtrip of the sensing node SO to the boosting voltage Vbst. Accordingly, the sensing node SO and the bit line BL0 are precharged with a voltage Vprch that corresponds to a sum of the trip voltage Vtrip and a voltage ΔV increased by the boosting.

At a point in time T2, the bit line BL0 and the sensing node SO are developed according to a data state of a selected memory cell. In this case, the boosting voltage Vbst is blocked, and the voltage Vprch precharged on the bit line BL0 and the sensing node SO may be discharged or maintained according to a data state of the selected memory cell. If the selected memory cell is an "ON" cell, the voltage Vprch precharged on the bit line BL0 and the sensing node SO sharply decrease. If the selected memory cell is an "OFF" cell, the voltage Vprch precharged on the bit line BL0 and the sensing node SO may decrease relatively slightly.

At a point in time T3, if the control signal BLSHF transitions to a low level, the bit line BL0 is electrically isolated from the sensing node SO. A voltage of the sensing node SO varied through the develop operation has to be transferred to the latch LT. The sensing enable signal SEN_EN may be provided in a pulse form to transfer a voltage of the developed sensing node SO to the latch LT. A level of the sampled trip voltage Vtrip may be still maintained on the developed sensing node SO. Accordingly, the voltage of the developed sensing node SO transferred to the latch LT may be provided as a value that is obtained by compensating for a trip voltage of the latch LT.

According to an embodiment, the sensing method including a trip voltage sampling process is above described. It may be possible to compensate for a variation in a trip voltage of the sensing latch 131 due to a temperature and process variations and various interferences, by sampling the trip voltage Vtrip of the latch LT.

Figure 7:
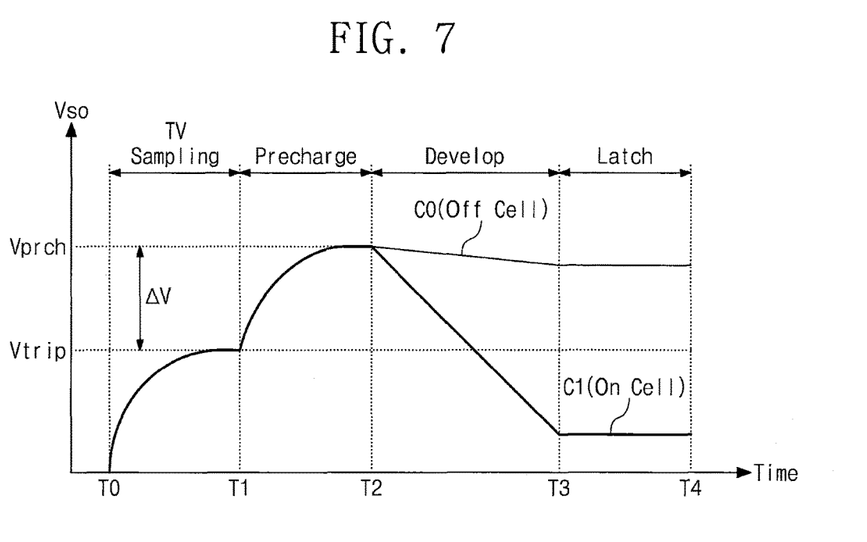
FIG. 7 is a waveform diagram illustrating a level variation in a sensing node at states of control signals of FIG. 6 for each step.

FIG. 7 is a waveform diagram illustrating a level variation of a sensing node SO in states of control signals of FIG. 6 for each step. Referring to FIG. 7, a level variation of the sensing node SO based on a data state of a memory cell is briefly illustrated. An interval from a point in time T0 to a point in time T1 may be referred to as a "trip voltage sampling period", an interval from a point in time T1 to a point in time T2 may be referred to as a "precharge period", an interval from a point in time T2 to a point in time T3 may be referred to as a "develop period", and an interval from a point in time T3 to a point in time T4 may be referred to as a "latch period".

In the trip voltage sampling period T0 to T1, the sensing node SO is electrically connected with the second node N2 of the latch LT through the turned-on sampling transistor NMS. The sensing node SO is charged with charges supplied from the pull-up transistor of the latch LT. According to the trip voltage sampling, a voltage of the sensing node SO may be increased by the trip voltage Vtrip through the ground transistor NM4. According to the trip voltage sampling of the inventive concept, the trip voltage Vtrip may be immediately sampled on the sensing node SO by the sampling transistor NM5 without an additional procedure.

In the precharge period T1 to T2, the precharge circuit 134 boosts voltages of the bit line BL0 and the sensing node SO. The boosting voltage Vbst generated by the boosting voltage generator 137 may be provided to the sensing node SO, which already has a level of the trip voltage Vtrip, by a trip voltage sampling operation. In this case, a voltage of the sensing node SO may be increased up to a level of the precharge voltage Vprch that is higher by ΔV than a level of the trip voltage Vtrip.

In the develop period T2 to T3, charging of the bit line BL0 and the sensing node SO with charges is completed, and the charges are discharged according to a data state of a memory cell. For example, when a memory cell connected to the bit line BL0 is an off cell, a relatively small amount of charges charged on the sensing node SO are discharged. Accordingly, a drop of the precharge voltage Vprch of the sensing node SO may be slight. A voltage variation of the sensing node SO corresponding to a develop period of the off cell is illustrated with a curve CO. In contrast, when a sensed memory cell is an on cell, a relatively great amount of charges charged on the sensing node SO are discharged. Accordingly, the precharge voltage Vprch of the sensing node SO may be sharply decreased. A voltage variation of the sensing node SO corresponding to a develop period of the on cell is illustrated with a curve C1.

In the latch period T3 to T4, if the control signal BLSHF transitions to a low level "L", the bit line BL0 is electrically isolated from the sensing node SO. A voltage of the sensing node SO varied through the develop operation has to be transferred to the latch LT. The sensing enable signal SEN_EN may be provided in a pulse form to transfer a voltage of the developed sensing node SO to the latch LT. A level of the sampled trip voltage Vtrip may be still maintained in the developed sensing node SO. Accordingly, a voltage of the sensing node SO transferred to the latch LT after developing may be provided as a value that is obtained by compensating for a trip voltage of the latch LT.

A read operation including a process of sampling a trip voltage of the latch LT is described with reference to the timing diagram as an example. The sensing node SO may be first charged by sampling of the trip voltage Vtrip. A voltage set up on the sensing node SO at this time is a value capable of compensating for the trip voltage Vtrip of the sensing latch 131.

Figure 8:
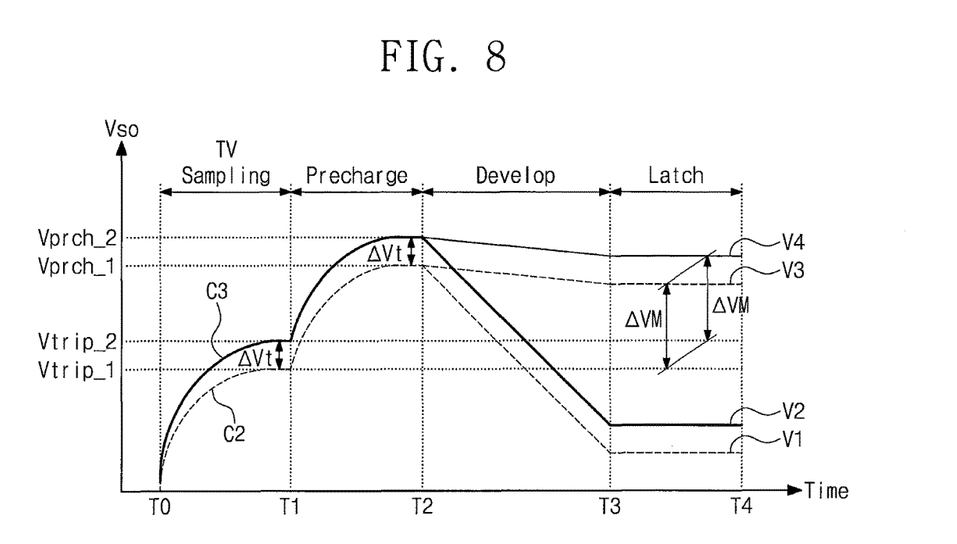
FIG. 8 is a timing diagram illustrating an effect of the inventive concept.

FIG. 8 is a timing diagram illustrating an effect of the inventive concept. Referring to FIG. 8, the read margin may be sufficiently secured even though the trip voltage Vtrip of the latch LT varies. Here, voltage curves C2 and C3 of the sensing node SO show phenomenon that occurs by sampling of different trip voltages Vtrip_1 and Vtrip_2 of latches.

At a point in time T0, sampling of the trip voltage Vtrip is performed. The sensing enable signal SEN_EN and the sampling control signal TV_SMPL provided from the control logic 150 for the sampling of the trip voltage Vtrip are activated to a high level "H". When the sensing enable signal SEN_EN from the control logic 150 is activated, the reset transistor NM3 (refer to FIG. 4) for connecting the latch LT and the sensing node SO is turned on. The sensing enable signal SEN_EN may be provided to have a relatively high gate voltage enough to turn on the reset transistor NM3. The sampling transistor NM5 is turned on when the sampling control signal TV_SMPL is activated. Accordingly, the second node N2 of the latch LT is electrically connected with the sensing node SO.

If the trip voltage Vtrip set up on the second node N2 of the latch LT is a first trip voltage Vtrip_1, a voltage of the sensing node SO may be increased to the first trip voltage Vtrip_1 by the charging of charges. A process of charging the sensing node SO with the first trip voltage Vtrip_1 is expressed with a dotted curve C2. If the trip voltage Vtrip set up on the second node N2 of the latch LT is a second trip voltage Vtrip_2 higher than the first trip voltage Vtrip_1, a voltage of the sensing node SO may be increased to the second trip voltage Vtrip_2. A process of charging the sensing node SO with the second trip voltage Vtrip_2 is expressed with a dotted curve C3. It is understood from the above description that a voltage level of the sensing node SO charged according to the trip voltage sampling operation varies with the trip voltage Vtrip of the latch LT. Such variation appears as a voltage difference ΔVt.

At a point in time T1, a precharge operation starts by applying the boosting voltage Vbst to the sensing node SO and the bit line BL0. For the precharge operation, the sensing enable signal SEN_EN and the sampling control signal TV_SMPL may be deactivated to a low level "L". In this case, the latch LT is electrically isolated from the sensing node SO. When the control signals BLSLT and BLSHF are activated to a high level "H", the bit line BL0 and the sensing node SO are electrically connected to each other. When the boosting enable signal Boost_EN is activated to a high level "H", the precharge circuit 134 boosts voltages of the sensing node SO and the bit line BL0.

Levels of voltages ΔVt of the sensing node SO and the bit line BL0 increased by the boosting are uniform regardless of a level of the sampled trip voltage Vtrip. Accordingly, the sensing node SO and the bit line BL0 are precharged according to the sampled trip voltage Vtrip by the boosting. That is, when the first trip voltage Vtrip_1 is sampled, voltages of the sensing node SO and the bit line BL0 may be increased to a first precharge voltage Vprch_1 that is boosted by ΔVt from the first trip voltage Vtrip_1 by the charging. In contrast, when the second trip voltage Vtrip_2 is sampled, voltages of the sensing node SO and the bit line BL0 may be a second precharge voltage Vprch_2 that is boosted by ΔVt from the second trip voltage Vtrip_2.

At a point in time T2 when a develop operation starts, the bit line BL0 and the sensing node SO are developed according to a data state of a selected memory cell. The precharge voltages Vprch_1 or Vprch_2 of the bit line BL0 and the sensing node SO vary with a state of a memory cell. However, the sampled trip voltage Vtrip may have an influence on voltages of the sensing node SO after the developing. That is, the sensing node SO precharged with the first precharge voltage Vprch_1 may be developed to V1 (on-cell) or V3 (off-cell). The sensing node SO precharged with the second precharge voltage Vprch_2 may be developed to V2 (on-cell) or V4 (off-cell).

Even though the develop operation is performed, the sensing node SO has a potential that varies with the sampled trip voltage Vtrip. That is, the sensing node SO is developed according to a state of a memory cell but maintains a level of the sampled trip voltage Vtrip.

At a point in time T3 when a latch operation is performed, the bit line BL0 is electrically isolated from the sensing node SO. A voltage of the sensing node SO varied through the develop operation is transferred to the latch LT. When the sensing enable signal SEN_EN is activated, a voltage of the developed sensing node SO is transferred to the second node N2 of the latch LT. In this case, a level of the sampled trip voltage Vtrip is maintained on the developed sensing node SO. That is, the sampled trip voltage Vtrip_1 or Vtrip_2 of the latch LT may be maintained until a point in time when a voltage of the sensing node SO is stored in the latch LT.

The sampled first trip voltage Vtrip_1 may be recovered upon sensing data after being charged on the sensing node SO. The read margin ΔVM of the latch LT may be secured when the first trip voltage Vtrip_1 is sampled as the trip voltage Vtrip of the latch LT. The same read margin ΔVM of the latch LT may be secured when the second trip voltage Vtrip_2 is sampled as the trip voltage Vtrip of the latch LT. According to the trip voltage sampling operation, the read margin ΔVM is not reduced even though a level of the trip voltage Vtrip of the latch varies.

Figure 9:
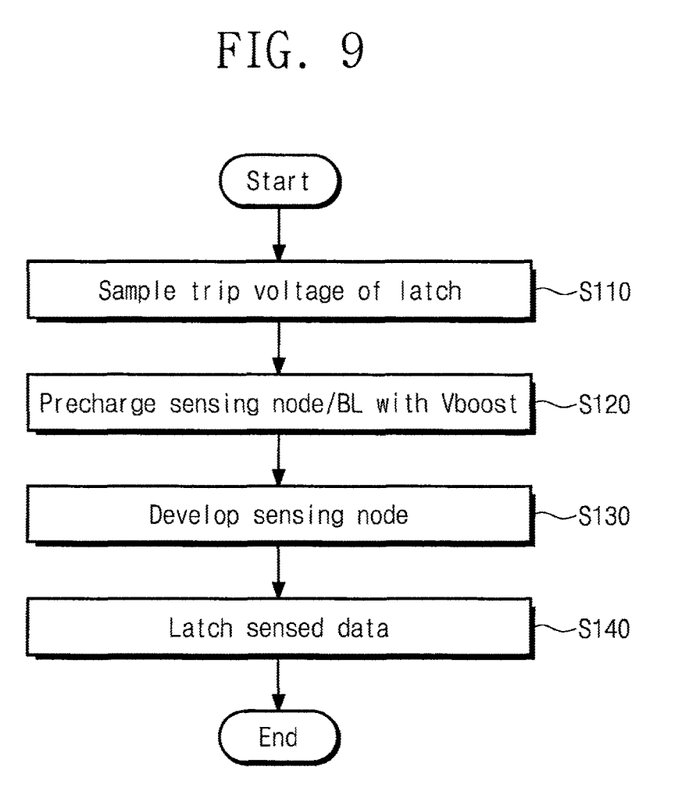
FIG. 9 is a flowchart illustrating a read method of a nonvolatile memory device, according to an embodiment of the inventive concept.

FIG. 9 is a flowchart illustrating a read method of a nonvolatile memory device, according to an embodiment of the inventive concept. A read method for improving the read margin through sampling of a trip voltage of a latch will be briefly described with reference to FIG. 9. When the nonvolatile memory device 100 receives a read command, the nonvolatile memory device 100 senses a selected memory cell.

In operation S110, a trip voltage sampling operation is performed on the sensing latch 131 of the latch LT. The second node N2 of the latch LT is electrically connected with the sensing node SO by the sampling transistor NMS. The sensing node SO is charged with charges supplied from a pull-up transistor of the latch LT. A voltage of the sensing node SO may be increased by the trip voltage Vtrip defined by the ground transistor NM4.

In operation S120, a boosting operation is performed on the bit line BL0 and the sensing node SO that are first charged with the trip voltage Vtrip. The boosting voltage Vbst generated by the boosting voltage generator 137 may be provided to the sensing node SO, which is previously charged with the trip voltage Vtrip. In this case, a voltage of the sensing node SO may be boosted from the trip voltage Vtrip to the precharge voltage Vprch.

In operation S130, the precharge voltage Vprch charged on the bit line BL0 and the sensing node SO is developed according to a data state of a memory cell. However, the charged trip voltage Vtrip may be maintained on the sensing node SO regardless of the develop operation. When a memory cell connected to the bit line BL0 is an off cell, a voltage drop of the sensing node SO is relatively small. In contrast, when a memory cell connected to the bit line BL0 is an on cell, a voltage drop of the sensing node SO is relatively large.

In operation S140, the bit line BL0 and the sensing node SO are electrically isolated from each other. A voltage of the sensing node SO varied through the develop operation is transferred to the latch LT. The reset transistor NM3 may be turned on when the sensing enable signal SEN_EN is activated. Accordingly, a voltage of the developed sensing node SO is applied to the second node N2 of the latch LT. The sampled trip voltage Vtrip may be still maintained on the developed sensing node SO. Accordingly, the voltage of the developed sensing node SO transferred to the latch LT may be provided as a value that is obtained by compensating for a trip voltage of the latch LT.

The read method of the nonvolatile memory device 100 for use in sampling the trip voltage Vtrip of the latch LT is above described. The sensing node SO is charged by a first sampled trip voltage Vtrip. When the sensing node SO is additionally charged during the precharge operation, a voltage of the sensing node SO may be boosted to a voltage level enough to sense. The sampled trip voltage Vtrip may be also maintained on the sensing node SO during the develop and data latch processes of the sensing node SO. Accordingly, a voltage of the sensing node SO, of which a level is compensated for by the trip voltage Vtrip, may be provided to a latch during a data sensing operation of the latch.

Figure 10:
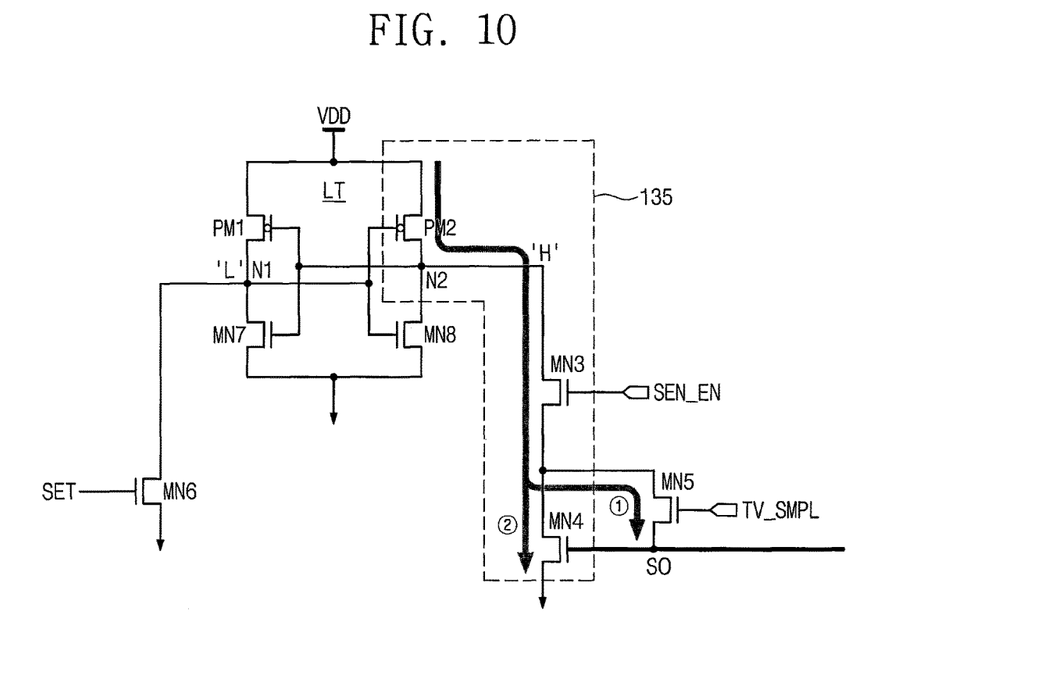
FIGS. 10 and 11 are circuit diagrams for describing a principle of sampling a trip voltage, according to an embodiment of the inventive concept.
Figure 11:
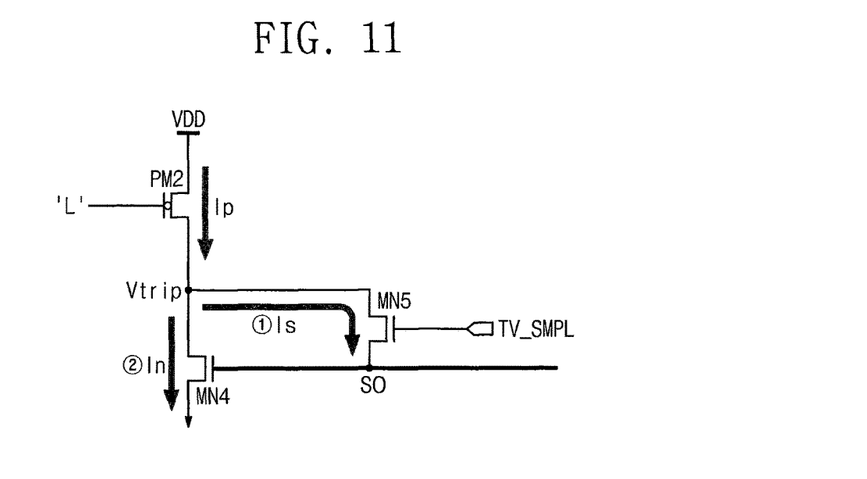

FIGS. 10 and 11 are circuit diagrams for describing a principle of sampling a trip voltage, according to an embodiment of the inventive concept. FIG. 10 is a circuit diagram illustrating a structure of the sensing latch 134 of FIG. 4 in detail. FIG. 11 is a schematic equivalent circuit diagram of a circuit of FIG. 10. Here, it is assumed that the first node N1 of the latch LT is set to a low level "L" and the second node N2 of the latch LT is set to a high level "H".

Referring to FIG. 10, the latch LT may be implemented with cross-coupled CMOS inverters. Accordingly, the first and second nodes N1 and N2 of the latch LT may maintain complementary logical values each other. In addition, the latch LT may be implemented with a level-sensitive bistable element. The first node N1 is used as both an output of a first inverter (PM1, NM7) and an input of a second inverter (PM2, NM8). The second node N2 is used as both an output of the second inverter (PM2, NM8) and an input of the first inverter (PM1, NM7).

A voltage at which the first and second nodes N1 and N2 are respectively set to stable logical values is referred to as a "trip voltage" Vtrip. To make a voltage of the second node N2 transition from a high level to a low level, a voltage of the second node N2 may be decreased to a level of the trip voltage Vtrip or lower. However, a level of the trip voltage Vtrip may vary with mismatch of threshold voltages of transistors constituting the latch LT, a temperature variation, a process variation, etc. To compensate for the variation, according to an embodiment of the inventive concept, a technology for sampling the trip voltage Vtrip is applied to the page buffer block 130.

A current path 135 formed upon sampling the trip voltage Vtrip is illustrated in FIG. 10. During a trip voltage sampling operation, first, the sensing enable signal SEN_EN and the sampling control signal TV_SMPL transition to a high level "H". In this case, the transistors NM3 and NM5 are turned on. Since a current logical level of the first node N1 is a low level, a pull-up transistor PM2 for pulling up the second node N2 to a power supply voltage VDD is at a turn-on state. The sensing node SO may be maintained at a low level "L" because a precharge operation is performed. Accordingly, the transistor NM4 is at a turn-off state. According to the above-described condition, a current supplied from the power supply voltage VDD may flow along a current path "①" to charge the sensing node SO. That is, the sensing node SO is first charged to sample the trip voltage Vtrip.

Next, the transistor NM4 is turned on when the sensing node SO is charged with a threshold voltage or higher. When the transistor NM4 is turned on, a current supplied from the power supply voltage VDD also flows to a current path "②". The sensing node SO may be charged with a threshold voltage of the transistor NM4 by separation of the current paths "①" and "②". In this case, the threshold voltage of the transistor NM4 acts as substantially the greatest factor of the trip voltage Vtrip. However, it may be well understood that the trip voltage Vtrip charged on the sensing node SO depends upon characteristics of the transistors PM2, NM3, and NM5.

FIG. 11 is a circuit diagram briefly illustrating the current paths "①" and "②" of FIG. 10. A circuit diagram of FIG. 11 is equivalent expression in which the reset transistor NM3, which maintains a turn-on state, of transistors constituting the current path 135 of FIG. 10 is omitted. The equivalent circuit is implemented under assumption that the sensing enable signal SEN_EN has a relatively high voltage.

The sampling transistor NM5 is turned on when the sampling control signal TV_SMPL is activated to a high level "H" to sample the trip voltage Vtrip. In this case, the ground transistor NM4 that is driven according to a voltage level of the sensing node SO may still be at a turn-off state. According to the above-described condition, a current Ip supplied by the pull-up transistor PM2 is mainly used as a charging current Is for charging the sensing node SO. In this case, a voltage of the sensing node SO may be increased until the ground transistor NM4 is turned on.

A voltage of the sensing node SO may be steeply increased until the ground transistor NM4 is turned on. However, if a voltage of the sensing node SO reaches a voltage in the vicinity of a threshold voltage of the ground transistor NM4, the ground transistor NM4 starts to be turned on. In this case, the current Ip supplied by the pull-up transistor PM2 flows into paths "①" and "②" of the charging current Is and a discharge current In. Charging of the sensing node SO with charges ends at a point in time when the amount of current Ip supplied by the pull-up transistor PM2 is the same as the amount of discharge current In. That is, a voltage of the sensing node SO may be fixed to a voltage in the vicinity of a threshold voltage of the ground transistor NM4. The above-described process is a principle of sampling the trip voltage Vtrip.

A process of sampling the trip voltage Vtrip is above described. A circuit is simplified for description, but it may be understood that a trip voltage optimized for mismatch of threshold voltages of all transistors constituting the sensing latch 131, a temperature variation, a process variation, etc. and a level of a sampled trip voltage are all applied to the sensing node SO.

An embodiment of the inventive concept, in which the trip voltage Vtrip of a latch included in a page buffer or a sense amplifier is sampled and the sampling result is applied to precharge the sensing node SO, is above described. However, the above-described embodiments are only exemplification to describe the scope and spirit of the inventive concept, and it may be understood that the embodiments are variously changed or modified.

According to an embodiment of the inventive concept, a variation in a trip voltage of a latch included in a sense amplifier of a memory device may be applied to a precharge level. Accordingly, a high sensing margin may be provided in a read operation by compensating for a variation in the trip voltage of the latch due to various factors.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a memory device, comprising:
   at least partially charging a sensing node within a page buffer to a first precharge voltage by sampling a trip voltage of a sensing latch within the page buffer, said sampling a trip voltage comprising sinking current from a first output node of the sensing latch to the sensing node; then
   boosting a voltage of the sensing node from the first precharge voltage to a higher second precharge voltage; then
   developing a voltage of the sensing node that reflects a value of data stored in a memory cell of the memory device; and then
   transferring the developed voltage to the sensing latch so that data stored by the sensing latch reflects the value of data stored in the memory cell.

2. The method of claim 1, wherein the page buffer comprises a boosting capacitor having a first terminal electrically connected to the sensing node; and wherein said boosting comprises driving a second terminal of the boosting capacitor with a voltage having a magnitude greater than the first precharge voltage.

3. The method of claim 1, wherein said developing comprises electrically coupling the sensing node to a bit line in the memory device, which is electrically connected to the memory cell.

4. The method of claim 3, wherein said at least partially charging a sensing node is performed while the bit line is electrically isolated from the sensing node.

5. The method of claim 2, wherein said boosting is performed while the bit line is electrically isolated from the sensing node.

6. The method of claim 1, wherein said at least partially charging a sensing node comprises electrically coupling a first node of the sensing latch to the sensing node.

7. The method of claim 6, wherein said electrically coupling a first node of the sensing latch to the sensing node comprises turning on a transistor having a gate terminal responsive to a sense enable signal; and wherein the sense enable signal is driven to a first logic level during said at least partially charging a sensing node and during at least a portion of said transferring the developed voltage to the sensing latch.

8. The method of claim 7, wherein said at least partially charging a sensing node is preceded by setting the trip voltage of the sensing latch to a logic high value by pulling a second node of the sensing latch to a logic low value, in response to an active set signal.

9. The method of claim 1, wherein said transferring the developed voltage to the sensing latch is followed by transferring the value of data stored in the memory cell from the sensing latch to an input/output buffer associated with the memory device.

10. The method of claim 1, wherein said at least partially charging a sensing node is preceded by setting the trip voltage of the sensing latch to a logic high value by pulling a node of the sensing latch to a logic low value, in response to an active set signal.

11. A read method of a memory device that senses data stored in a memory cell by using a latch, the method comprising:
   a first charging operation of sampling a trip voltage of the latch to charge a bit line or a sensing node connected to the memory cell with the sampled trip voltage, said sampling a trip voltage of the latch comprising sinking current from a first output node of the latch to the bit line or the sensing node;
   a second charging operation of boosting the boosting node up to a precharge voltage by applying a boosting voltage to the bit line or the sensing node charged with the sampled trip voltage;
   an operation of developing the sensing node or the bit line, which is boosted up to the precharge voltage, based on data stored in the memory cell; and
   an operation of transferring the developed voltage of the sensing node or bit line to the latch to latch the data.

12. The method of claim 11, wherein the first charging operation comprises:
   turning on a sampling transistor for connecting one end of the latch and the sensing node.

13. The method of claim 12, wherein the bit line and the sensing node are electrically isolated from each other in the first charging operation.

14. The method of claim 12, wherein a level of the trip voltage is determined by a ground transistor connecting the one end of the latch and a ground based on a voltage of the sensing node.

15. The method of claim 14, wherein the level of the trip voltage is determined by a ratio of the amount of current supplied from a pull-up transistor of the latch to the amount of current flowing to the ground transistor.

16. The method of claim 11, further comprising:
   an operation of generating the boosting voltage in the second charging operation.

17. The method of claim 16, wherein the boosting voltage is generated to have a magnitude that boosts a voltage of the sensing node or the bit line up to the precharge voltage.

18. The method of claim 16, wherein the boosting voltage is provided to the sensing node or the bit line by a boosting capacitor.

19. A nonvolatile memory device comprising:
   a memory cell;
   a page buffer connected with a bit line of the memory cell and comprising a latch that senses data stored in the memory cell through the bit line and a sensing node connected to the bit line; and control logic controlling the latch during a read operation to sample a trip voltage of the latch, to charge the sensing node with the sampled trip voltage, and to charge the sensing node, which is charged with the trip voltage, up to a precharge voltage, wherein the trip voltage is sampled by electrically connecting one output of the latch to the sensing node so that current is sinked from the output of the latch to the sensing node until the sensing node is charged at least partially to the precharge voltage.

20. The nonvolatile memory device of claim 19, wherein the page buffer comprises:

a sampling transistor connecting the one end of the latch and the sensing node in response to a sampling enable signal from the control logic for sampling of the trip voltage.

21. The method of claim 1, wherein said sampling a trip voltage is preceded by pulling a second output node of the sensing latch to a first logic state to thereby set the first output node of the sensing latch to a second logic state.

22. The method of claim 21, wherein the first logic state is a logic "0" state and the second logic state is a logic "1" state.

23. The method of claim 21, wherein said sampling a trip voltage comprises sinking current through an NMOS transistor having a current carrying terminal electrically connected to the first output node.

24. The method of claim 1, wherein said sampling a trip voltage comprises sinking current through an NMOS transistor having a current carrying terminal electrically connected to the first output node.

* * * * *